(12) United States Patent
Zalalutdinov et al.

(10) Patent No.: US 7,812,502 B2
(45) Date of Patent: Oct. 12, 2010

(54) SHELL TYPE ACTUATOR

(75) Inventors: Maxim Zalalutdinov, Silver Springs, MD (US); Robert B. Reichenbach, Ithaca, NY (US); Keith Aubin, Freeville, NY (US); Brian H. Houston, Fairfax, VA (US); Jeevak M. Parpia, Ithaca, NY (US); Harold G. Craighead, Ithaca, NY (US)

(73) Assignees: Cornell Research Foundation, Inc., Ithaca, NY (US); Navel Research Laboratory, Washington, DC (US)

( * ) Notice: Subject to any disclaimer, the term of this patent is extended or adjusted under 35 U.S.C. 154(b) by 0 days.

(21) Appl. No.: 11/358,299

(22) Filed: Feb. 20, 2006

(65) Prior Publication Data

US 2006/0239635 A1 Oct. 26, 2006

Related U.S. Application Data

(63) Continuation of application No. PCT/US2004/027162, filed on Aug. 20, 2004.

(60) Provisional application No. 60/496,421, filed on Aug. 20, 2003, provisional application No. 60/496,431, filed on Aug. 20, 2003, provisional application No. 60/496,430, filed on Aug. 20, 2003.

(51) Int. Cl.
*H02N 10/00* (2006.01)
*H01L 41/04* (2006.01)
(52) U.S. Cl. ..................... 310/306; 310/324
(58) Field of Classification Search ............. 310/371, 310/306, 320, 324, 367, 369
See application file for complete search history.

(56) References Cited

U.S. PATENT DOCUMENTS

| 4,276,491 | A | * | 6/1981 | Daniel | 310/317 |
| 5,188,983 | A | * | 2/1993 | Guckel et al. | 438/53 |
| 6,222,304 | B1 | * | 4/2001 | Bernstein | 310/328 |
| 6,271,052 | B1 | | 8/2001 | Miller et al. | |
| 6,698,201 | B1 | * | 3/2004 | Sarkar et al. | 60/527 |
| 2002/0086455 | A1 | | 7/2002 | Franosch et al. | |

(Continued)

FOREIGN PATENT DOCUMENTS

EP 0451992 A2 10/1991

(Continued)

OTHER PUBLICATIONS

Adams, S. G., et al., "Capacitance Based Tunable Resonators", *Journal of Micromechanics and Microengineering*, 8, (1998), 15-23.

(Continued)

*Primary Examiner*—Walter Benson
*Assistant Examiner*—Derek J Rosenau
(74) *Attorney, Agent, or Firm*—Schwegman, Lundberg & Woessner, P.A.

(57) ABSTRACT

A micromechanical resonator is formed on a substrate. The resonator has a partial spherical shell clamped on an outside portion of the shell to the substrate. In other embodiments, a flat disc or other shape may be used. Movement is induced in a selected portion of the disc, inducing easily detectible out-of-plane motion. A laser is used in one embodiment to heat the selected portion of the disc and induce the motion. The motion may be detected by capacitive or interferometric techniques.

31 Claims, 7 Drawing Sheets

U.S. PATENT DOCUMENTS

2002/0126387 A1* 9/2002 Ishikawa et al. ............ 359/578
2004/0004532 A1* 1/2004 Davis et al. .................... 337/53

FOREIGN PATENT DOCUMENTS

WO    WO-2005020434 A2    3/2005
WO    WO-2005020434 A3    3/2005

OTHER PUBLICATIONS

Aubin, K. L., "Laser Annealing for High-Q MEMS Resonators", *Proceedings of SPIE*, 5116, (Apr. 30, 2003),531-535.
Carr, S. M., et al., "Elastic Instability of Nanomechanical Beams", *Applied Physics Letters*, 82(5), (Feb. 3, 2003), 709-711.
Carr, D., "Fabrication of Nanoelectromechanical Systems in Single Crystal Silicon Using Silicon on Insulator Substrates and Electron Beam Lithography", *Journal of Vacuum Science & Technology B.*, 15(6), (1997), 2760-2763.
Chaudhry, Z., et al., "Modeling of Induced Strain Actuation of Shell Structures", *The Journal of the Accoustical Society of America*, 97(5), (May 1995), 2872-2877.
Cleland, A. N., et al., "A Nanometre-Scale Mechanical Electrometer", *Nature*, 392, (Mar. 12, 1998), 160-162.
Golio, M., *The RF and Microwave Handbook*, 'CRC Press,(2001), 2-6-2-10.
Houston, B. H., et al., "Thermoelastic Loss in Microscale Oscillators", *Applied Physics Letters*, 80(7), (Feb. 18, 2002), 1300-1302.
Hsu, W.-T., et al., "Mechanically Temperature-Compensated Flexural-Mode Micromechanical Resonators", *IEDM Technical Digest, International Electron Devices Meeting*, (2000), 399-402.
Huang, X. M., "Nanodevice Motion at Microwave Frequencies", *Nature*, 421(6922), (Jan. 30, 2003), p. 496.
Jeffrey, A., *Advanced Engineering Mathematics*, Harcourt/Academic Press, Burlington, MA, (2002), 1004-1006.
Jenkins, D. F., et al., "The Use of Sputtered ZnO Piezoelectric Thin Films as Broad-Band Microactuators", *Sensors and Actuators A*, 63, (1997),135-139.
Lalande, F., et al., "Modeling Considerations for In-Phase Actuation of Actuators Bonded to Shell Structures", *AIAA Journal*, 33(7), (Jul. 1995),1300-1304.
Lee, S., et al., "A 10-MHz Micromechanical Resonator Pierce Reference Oscillator for Communications", *Digest of Technical Papers, 11th International Conference on Solid-State Sensors & Actuators (TRANSDUCERS '01)* (2001), 1094-1097.
Lifshitz, R., et al., "Thermoelastic Damping in Micro- and Nanomechanical Systems", *Physics Review B*, 61(8), (Feb. 15, 2000), 5600-5609.
Liu, X., et al., "Low-Temperature Internal Friction in Metal Films and in Plastically Deformed Bulk Aluminum", *Physical Review B*, 59(18), (May 1999), 11767-11776.
Llic, B., et al., "Single Cell Detection With Micromechanical Oscillators", *J. Vac. Sci. Technol. B*, 19(6), (Nov./Dec. 2001), 2825-2828.
Maier-Schneider, D., et al., "Elastic Properties and Microstructure of LPCVD Polysilicon Films", *Journal of Micromechanics and Microengineering*, 6, (1996), 436-446.
Mattila, T., et al., "14 MHz Micromechanical Oscillator", *Sensors and Actuators A—Physical*, 97-98, (2002), 497-502.
Mattila, T., et al., "A 12 MHz Micromechanical Bulk Acoustic Mode Oscillator", *Sensors and Actuators A*, 101, (2002), 1-9.
Morse, P. M., et al., *Theoretical Acoustics*, Princeton University Press, Princeton, N.J.,(1968), p. 214.
Nguyen, C. T., et al., "Transceiver Front-End Architectures Using Vibrating Micromechanical Signal Processors", *Digest of Papers. 2001 Topical Meeting on Silicon Monolithic Integrated Circuits in RF Systems*, (2001), 23-32.
Nguyen, C. T., "Vibrating RF MEMS for Low Power Wireless Communications (Invited)", *Proceedings, 2000 International Workshop (iMEMS '01)*, (2001), 21-34.
Que, L., et al., "Bent-Beam Electrothermal Actuators—Part I: Single Beam and Cascaded Devices", *Journal of Microelectromechanical Systems*, 10(2), (Jun. 2001), 247-254.

Rugar, D., et al., "Mechanical Parametric Amplification and Thermomechanical Noise Squeezing", *Physics Review Letters*, 67(6), (1991), 699-702.
Sodel, W., "A Natural Frequency Analogy Between Spherically Curved Panels and Flat Plates", *Journal of Sound and Vibration*, 29(4), (1973) ,457-461.
Sodel, W., "Shell Vibrations Without Mathematics", *Sound and Vibration*, 10(4), (Apr. 1976),12-15.
Timoshenko, S. P., et al., *Theory of Elastic Stability*, 2nd Edition, McGraw-Hill Book Company, Inc., New York, N.Y.,(1961), 389-392.
Tylikowski, A., "Stability and Stabilization of Thermally Induced Vibrations of Cylindrical Shells", *Journal of Thermal Stresses*, 24(6), (2001),605-628.
Warneke, B. A., et al., "49.4: An Autonomous 16 $mm^3$ Solar-Powered Node for Distributed Wireless Sensors Networks", *Proceedings of IEEE Conference on Sensors*, vol. 2, (2002), 1510-1515.
Yang, J., et al., "Surface Effects and High Quality Factors in Ultrathin Single-Crystal Silicon Cantilevers", *Applied Physics Letters*, 77(23), (Dec. 4, 2000), 3860-3862.
Yasumura, K. Y., et al., "Quality Factors in Micron- and Submicron-Thick Cantilevers", *Journal of Microelectromechnical Systems*, 9(1), (Mar. 2000), 117-125.
Zalalutdinov, M., "Autoparametric Optical Drive for Micromechanical Oscillators", *Applied Physics Letters*, 79(5), (Jul. 30, 2001),695-697.
Zalalutdinov, M., "Frequency Entrainment for Micromechanical Oscillator", *Applied Physics Letters*, 83(16), (Oct. 20, 2003),3281-3283.
Zalalutdinov, M., et al., "Optically Pumped Parametric Amplification for Micromechanical Oscillators", *Applied Physics Letters*, 78(20), (May 14, 2001), 3142-3144.
Zhang, Z., et al., "Magnetic Resonance Force Microscopy With a Ferromagnetic Tip Mounted on the Force Detector", *Solid State Nuclear Magnetic Resonance*, 11, (1998), 65-72.
Ziger, D. H., et al., "Process Factors in Ammonia Catalyzed Image Reversal", *Semiconductor International*, 11(6), (May 1988), 200-204.
Abdelmoneum, M. A., et al., "Stemless Wine-Glass-Mode, Disk Micromechanical Resonators", *Proceedings of the IEEE 16th Annual International Conference on Microelectromechanical Systems*, 16, (Jan. 19, 2003),698-701.
Bircumshaw, B., et al., "The Radial Bulk Annular Resonator: towards a 50' Omega! RF MEMS Filter", *Transducers '03 12th International Conference on Solid-State Sensors, Actuators and Microsystems. Digest of Technical Papers (CAT. No. 03TH8664) IEEE*, 1, (Jun. 2003),875-878.
Clark, J. R., "High-Q VHF Micromechanical Contour-Mode Disk Resonators", *IEDM, IEDM Technical Digest.*, (Dec. 10, 2000),493-496.
Kazinczi, R., "3-D Resonator Bridges as Sensing Elements", *Sesens Workshop on Semiconductor Sensors*, (Dec. 1, 2000),804-805.
Reichenbach, R. B., "Resistively Actuated Micromechanical Dome Resonators", *Proceedings of the SPIE-The International Society for Optical Engineering SPIE-INT*, 5344 (1), (Jan. 27, 2004),51-58.
Zalalutdinov, M., et al., "Shell-Type Micromechanical Actuator and Resonator", *Applied Physics Letters*, 83 (18), (Nov. 3, 2003),3815-3817.
Zalalutdinov, M., "Shell-type Micromechanical Oscillator", *Proceedings of the SPIE*, vol. 5116, (May 19, 2003),229-236.
"Chinese Application Serial No. 200480030868.0, Office Action mailed Aug. 1, 2008", 17 pgs.
"International Application Serial No. PCT/US2004/027162, International Search Report mailed Feb. 18, 2005", 6 pgs.
"International Application Serial No. PCT/US2004/027162, Written Opinion mailed Feb. 18, 2005", 8 pgs.
"U.S. Appl. No. 11/358,299, Advisory Action mailed Jun. 13, 2008", 3 pgs.

* cited by examiner

SHELL TYPE ACTUATOR

RELATED APPLICATION

This application is a Continuation Under 35 U.S.C. §1.111 (a) of International Application No. PCT/US2004/027162, filed Aug. 20, 2004 and published in English as WO 2005/020434 on Mar. 3, 2005, which claims priority to U.S. Provisional Application Ser. No. 60/496,421 (entitled Shell-Type Micromechnical Actuator and Resonator, filed Aug. 20, 2003) which is incorporated herein by reference. This application also claims priority to U.S. Provisional Application Ser. No. 60/496,431 (entitled Method and Apparatus for Thermal-Mechanical Signal Processing, filed Aug. 20, 2003), which is incorporated herein by reference. This application also claims priority to U.S. Provisional Application Ser. No. 60/496,430 (entitled Laser Annealing for MEMS Devices, filed Aug. 20, 2003), which is incorporated herein by reference.

GOVERNMENT FUNDING

The invention described herein was made with U.S. Government support under Grant Number DMR0079992 awarded by the National Science Foundation. The United States Government has certain rights in the invention.

BACKGROUND

The development of radio frequency microelectromechanical systems (RF MEMS) is largely motivated by possible applications in wireless communication devices. High quality, miniature and CMOS-technology compatible MEMS resonators are seen as an attractive alternative to existing RF passive components. In contemporary RF devices frequency-determining elements are implemented in two major ways. The first requires microfabrication of capacitors and inductors on-chip. Even though they consume the major part of the IC "real estate" and exhibit a low quality factor $Q\sim50$, on-chip LC circuits are widely used for GHz-range devices.

Alternatively, quartz crystals, surface acoustic wave (SAW) filters, ceramic filters and high-Q LC are implemented as stand-alone elements and create a bottleneck for future miniaturization of RF devices. Their high quality factor ($Q\sim10^6$ for quartz resonators and $Q\sim10^5$ for ceramic SAW filters) plus high temperature stability, both indispensable features for wireless devices, force RF designers to accept these off-chip components. This approach conflicts with modem trends in wireless systems, especially those that require a radio-on-chip to be implemented with the smallest size and for the lowest price.

Micromechanical resonators as frequency-determining elements are expected to be the key for the radio-on-chip project. Modem surface micromachining tools allow fabrication of suspended silicon structures with a fundamental frequency of mechanical vibrations, $f_0$, in the RF range. The MEMS resonator quality factor $Q\sim10^4$ is a few order of magnitude superior compared to LC circuits. MEMS based signal generators and frequency standards may be incorporated into nearly any RF device.

The natural approach for building such a generator is to implement the MEMS resonator as a frequency determining element in the feedback loop of an amplifier and to provide conditions for self-sustained oscillations. The strain energy $kx^2/2$, stored in a MEMS resonator can be comparable to electric energy $LI^2/2$ in a conventional inductor.

However, methods to convert the electrical signal into mechanical motion of the resonator (drive) and back (detection) represent the major challenge in RF MEMS design. Piezoelectric transduction requires piezoelectric materials incompatible with CMOS technology. Magnetomotive methods for driving and detection used to demonstrate the highest resonant frequency in MEMS rely on high magnetic field and low temperatures.

It has been demonstrated that micromechanical reference oscillators can be operated using electrostatic drive and detection. However, capacitive methods are difficult to implement: relatively high voltage is required and narrow gap capacitors for both drive and detection impose significant restrictions on the design. Both oscillators employ beam-like geometry resulting in relatively low quality factor $Q\sim10^3$. Problems related to cross-talk between drive and detection can be severe. The phase noise for either of these devices is significantly higher than one would expect from similar quartz-based oscillators and both groups attribute this extra phase noise to capacitive transduction problems. This motivates ongoing search for new design of micromechanical resonators and novel drive-detection methods.

SUMMARY

Radio frequency shell-type polysilicon micromechanical resonators (bowed up out-of-plane) may be fabricated employing the compressive stress incorporated in low pressure chemical vapor deposition (LPCVD)-deposited film. Thermal stress, such as that introduced by modulated laser light or other thermal modulation inducement provides an effective driving mechanism for the shell or dome-type resonators.

In one embodiment, all-optical operation may be obtained by employing two different wavelength laser beams for drive and detection. The local nature of the laser actuation technique induces modes of vibration that are not easily seen using a piezo-electric or capacitive drive. Mode identification may be achieved by monitoring the phase shift between drive signal and detected motion at different locations. A frequency generator utilizing positive feedback may demonstrate frequency stability of better than 1 ppm.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
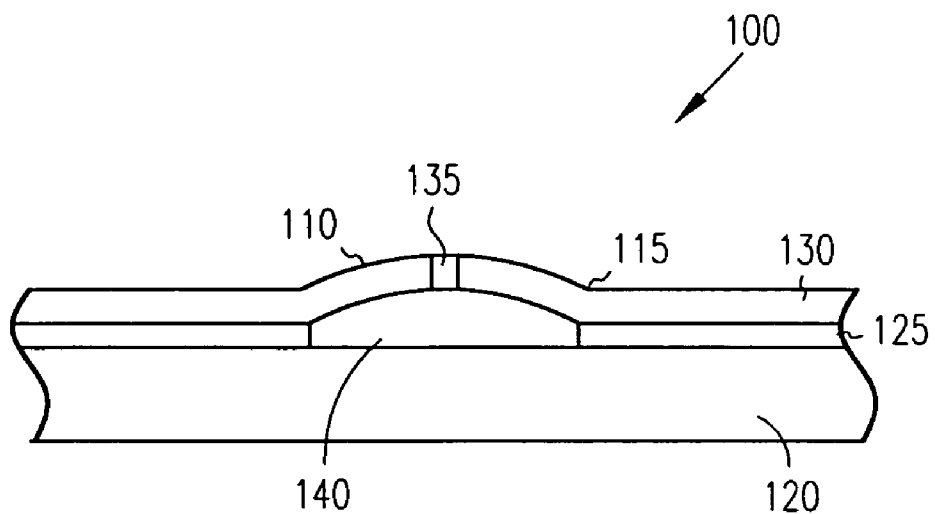
FIG. 1 is a cross sectional block diagram of a dome type actuator according to an example embodiment.
Figure 2:
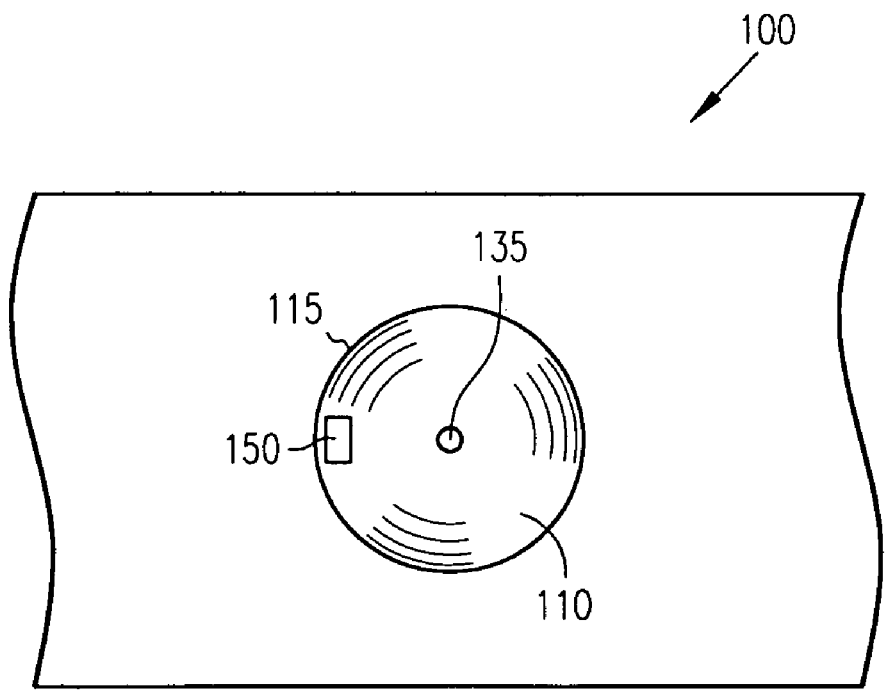
FIG. 2 is a top view of the dome type actuator of FIG. 1.

A micromechanical dome shaped actuator is indicated generally at 100 in cross section in FIG. 1. FIG. 2 provides a top view of the actuator 100. The actuator comprises a membrane 110 of polysilicon or other flexible material in the shape of a partial spherical shell supported at its edges 115 by a substrate 120. The use of the term, spherical, is not meant to require a perfect spherical shape, but merely to indicate that it is somewhat curved in some embodiments. As a first step of fabrication, 1 μm of thermal oxide 125 is grown on a surface of a [100] silicon wafer such as substrate 120. This oxide 125 is used later as a sacrificial layer. Other sacrificial layers may also be used.

In one embodiment, a polycrystalline silicon film 130 is deposited on the surface of the oxide 125 such as by low pressure chemical vapor deposition (LPCVD) at approximately 590° C. Other methods of forming such a film may also be used, and the film may also be formed of different materials that exhibit desirable vibration characteristics. After the deposition of the film 130, the substrate 120 is annealed for approximately 15 min. at approximately 1050° C. E-beam lithography followed by a $CF_4$ dry etch are used to create an approximately 8 μm-diameter hole 135 through the top polysilicon layer 130. The hole may be varied in size, and is approximately 4 μm in one embodiment. The dimensions and processes used may be varied significantly to produce vibrating dome structures.

The micromechanical actuator may very in size from micron dimensions to nanometer dimensions. The size may be directly related to its resonant frequency, which is desired to be in the RF or higher ranges in some embodiments. In one embodiment, the film is approximately 200 nm thick. The sacrificial layer may vary in depth or thickness, and is approximately 1560 nm thick in one embodiment. These thicknesses may be varied significantly, along with the process parameters used to produce them. In one embodiment, the process parameters are selected to provide a significant compressive stress inside the resulting polysilicon layer. Such stresses may be in excess of 220 MPa.

After stripping off the resist used in the lithographic process, the actuator 100 is dipped into concentrated hydrofluoric acid (HF 49%). Dissolving the sacrificial silicon dioxide (etch rate ~1 m/min) results in a suspended membrane-like structure with a hole at the center. The membrane-like structure resembles a dome or shell. The etching time determines the outer diameter of a cavity 140 underneath the polysilicon film. Other etching solutions may also be used, and may be dependent on the type of sacrificial layer and film utilized to obtain desired etching characteristics.

If the polysilicon layer 130 is stress-free, the released membrane becomes flat. However, significant compressive stress incorporated in the polysilicon film 130 as a result of deposition and annealing parameters makes the planar configuration unstable and leads to a buckled membrane. The resulting structure has a dome shape 110 with a hole 135 at the top. The dome slopes down from the top, toward its outer diameter 115. In one embodiment, an outer diameter of 60 μm is obtained. The dome may also be thought of as buckling-up, allowing it to move freely in response to force. Using critical point dry (CPD) process to avoid surface tension, high yields may be obtained. In one embodiment, desirable buckling occurs with a radius of undercut exceeding approximately 6 μm given one particular built-in stress and thickness of the film. Other undercuts may provide such buckling at a different radius of undercut.

Other methods may also be used to fabricate shell-type resonators. Deposition of shell material on a pre-curved sacrificial layer may be used to increase the dome's curvature and further enhance the resonant frequency. Such shell material need not be pre-stressed in this embodiment.

Many different methods of inducing movement in the dome 110 may be utilized. While exhibiting such motion, the dome may be referred to as a dome resonator 110. In one embodiment, selected portions of the dome 110 are heated by laser. The frequency of the laser may be varied, and large deflections or resonation of the dome occurs when the laser is tuned to the resonant frequency of the laser.

A further method of inducing movement in the dome 110 involves the use of a resistive heater that is microfabricated on the face of the dome, such as by use of photolithography with image reversal and lift off. In one embodiment, such a resistive heater is approximately a 6 μm wide meander metal heater represented by a block 150. One example heater has a resistivity $R_{heater}$=6 Ohm/square, and comprises 20 nm of gold on a 10 nm titanium adhesion layer. Such layers may be deposited using electron beam evaporation techniques or other suitable techniques. Other potential materials for a resistive heater include aluminum. Other devices may alternatively be used to provide selective heating of the dome. Other techniques for inducing motion of the dome include thermal expansion, magnetostriction, optically-induced stress or piezoelectric effects. The total resistance of the heater in one embodiment is 50 ohms, which may provide matching conditions with previous RF stages.

Very local, or spatially highly inhomogeneous, in-plane stress is used to induce out-of-plane, easily detectible motion. Besides resulting distortion of a dome shape, this heat induced, time variable local stress can be used to launch surface acoustic waves. The method of actuation creates such distortion, even in flat resonators. Thus, the resonator need not be dome shaped, but can be flat in some embodiments, such as a circular disk.

A generally circular shape of the resonator is beneficial in a sense that the stressed area can be expanded to form a narrow ring along significant part of the circumference of the dome. This may result in the drive being more efficient as compared to a bridge type resonator. The circular shape and thermal drive are a good match for capacitive methods of detection of the resulting motion. The circular shape provides sufficient surface area to form a capacitor. Not using a capacitive drive results in smaller fringing fields and hence much less cross-talk between drive and detection.

Figure 3:
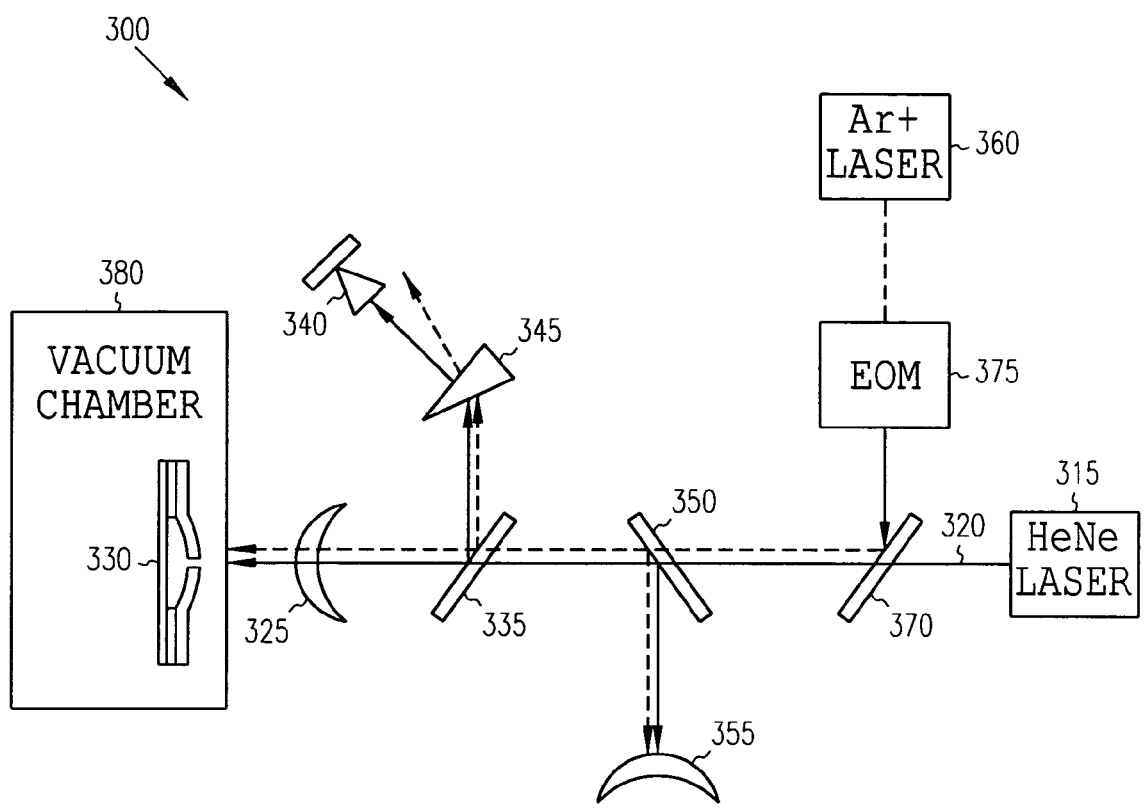
FIG. 3 is a schematic block diagram of a device for detecting motion of a dome type actuator according to an example embodiment.

A further method of detection utilizes an interferometric technique illustrated generally at 300 in FIG. 3. Such technique is a natural choice for detection of the motion of the dome resonator 110 because the thin polysilicon shell and wafer create a Fabry-Perot interferometer. A reflection coefficient R for 630nm light wavelength as a function of a gap h between a released membrane 110 and the substrate 120 shows a strong periodic dependence R(h) allowing detection of oscillatory motion of the resonator by measuring an AC component of the reflected light intensity.

An HeNe laser 315 is used to provide a beam 320 that is focused by an objective lens 325 onto a 2 μm spot size on the surface of a dome resonator 330. The same lens 325 is used to collect the reflected light. A nonpolarizing beam splitter 335 is used to direct the reflected laser beam to a wideband photodetector 340. Another beam splitter 350 and white light source provide an optical image of the structure at a microscope 355.

The laser beam may be positioned on any spot of interest by monitoring this image on a microscope 355 screen. A second laser (Ar+) at 360 may be used to provide a blue laser beam. A system of mirrors and a beamsplitter 370 are used to direct the blue laser beam through the same objective lens. It is focused into a 2 μm spot and can be positioned independently of the red (HeNe) laser beam 320. The intensity of the Ar⁺ laser can be controlled by Electro Optical Modulator (EOM) 375 with an 80 MHz bandwidth. An additional dispersing prism 345 may be positioned in front of the photodetector to avoid saturation by the blue laser.

Figure 4:
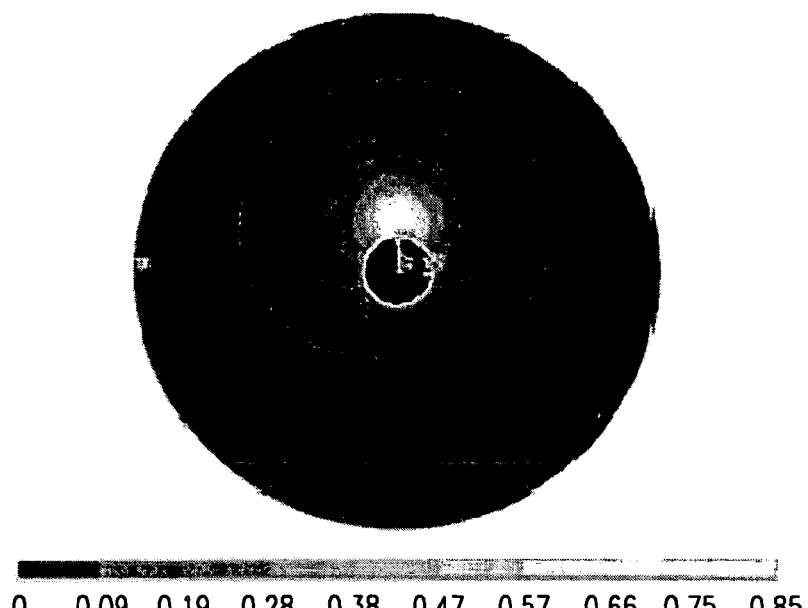
FIG. 4 is an illustration of thermal distribution of a dome type actuator heated by a laser beam according to an example embodiment.
Figure 5:
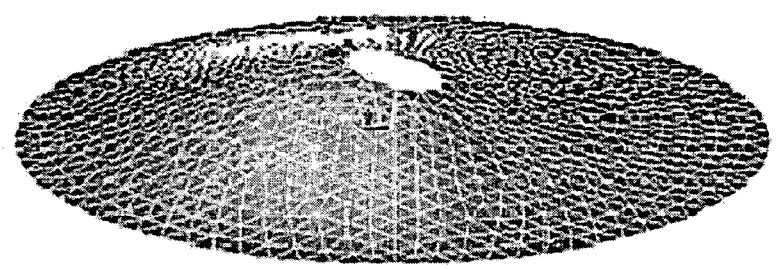
FIG. 5 is an illustration of deformity of the dome type actuator of FIG. 4 according to an example embodiment.

In one embodiment, the dome resonator 330 is mounted inside an ion pump-based vacuum system 380 (P<$10^{-7}$ Torr) with a fused silica window for optical access. The double laser beam configuration allows an all-optical operation of the shell-type resonator. The dome exhibits a large amplitude out-of-plane vibration (detected using the red laser) when heated by the blue laser, modulated at the resonant frequency. The physical mechanism for the laser drive is related to the thermomechanical stress created by the focused laser beam within the shell. FIG. 4 and FIG. 5 illustrate the result of finite element analysis (FEA) for the temperature distribution within the shell and the shell deformation respectively caused by the local thermal expansion. The absorption of 50 μW laser power induces a 0.85 K temperature increase at the beam spot. For a flat membrane case such a local overheating would build up an in-plane stress but would be too small to create an out-of-plane buckling. In contrast here, due to the 3-Dimensional nature of the dome oscillator the thermal stress is free to be released by the out-of-plane deformation. Static deflection caused by a 50 μW laser beam is estimated to be 0.3 nm as shown in FIG. 4. The corresponding amplitude of the in-resonance vibrations would be enhanced up to 3 μm by the quality factor of the resonator Q~$10^4$ if it were not limited by non-linear effects.

It should be emphasized that the light pressure effect on the dome shape is negligible (five orders of magnitude weaker than the thermal stress drive). The all-optical operation of the micromechanical resonators greatly simplifies design of the device, eliminating the need for metallization, capacitive pick-up electrodes, piezoelements etc. The bare silicon resonator can be exposed to a wide range of temperatures or corrosive atmospheres while preserving full functionality.

The driving-detection technique that is implemented by two independently positioned laser beams provides a tool to enable the identification of the resonator's modes. Since the excitation by the driving beam is provided locally, in a point-like manner, one can raster the spot of the detecting (red) laser across the structure and build a map of the phase shift between the driving signal and detected motion for every particular location. For a circular symmetrical structure like the dome or a disc resonator it is natural to assume that the excited mode will have a maximum at the driving laser beam location. Superimposing the detecting laser over the driving beam should produce an in-phase signal. As the red laser's spot is displaced from the position of the blue laser spot, it may traverse a nodal diameter or a circular node (depending on the particular excited mode). At that point the phase shift between the driving signal and the detected motion will change by 180°, which can be readily detected by a network analyzer. In a real experiment it is more convenient to move the drive laser beam and preserve the alignment of the detecting beam with the photodetector.

Figure 6:
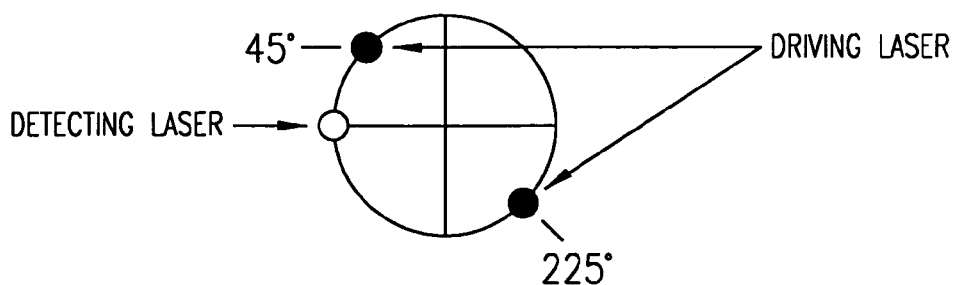
FIG. 6 is a graph showing rectangular coordinate locations of a driving laser on a dome type actuator according to an example embodiment.
Figure 7:
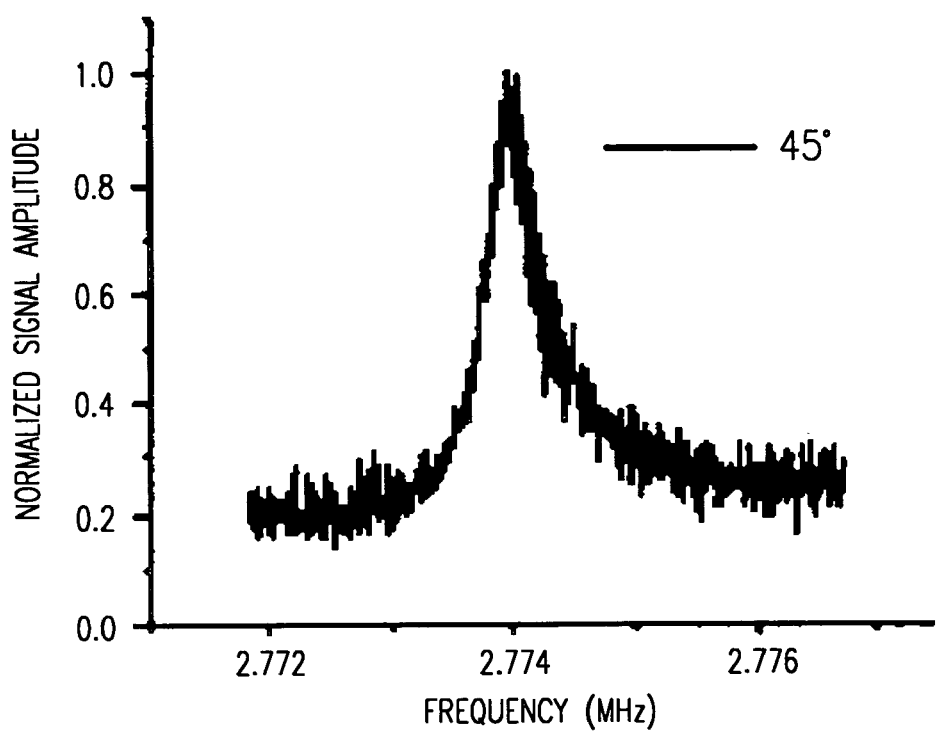
FIG. 7 is a graph showing normalized signal amplitude for one of the driving laser locations of FIG. 6.
Figure 8:
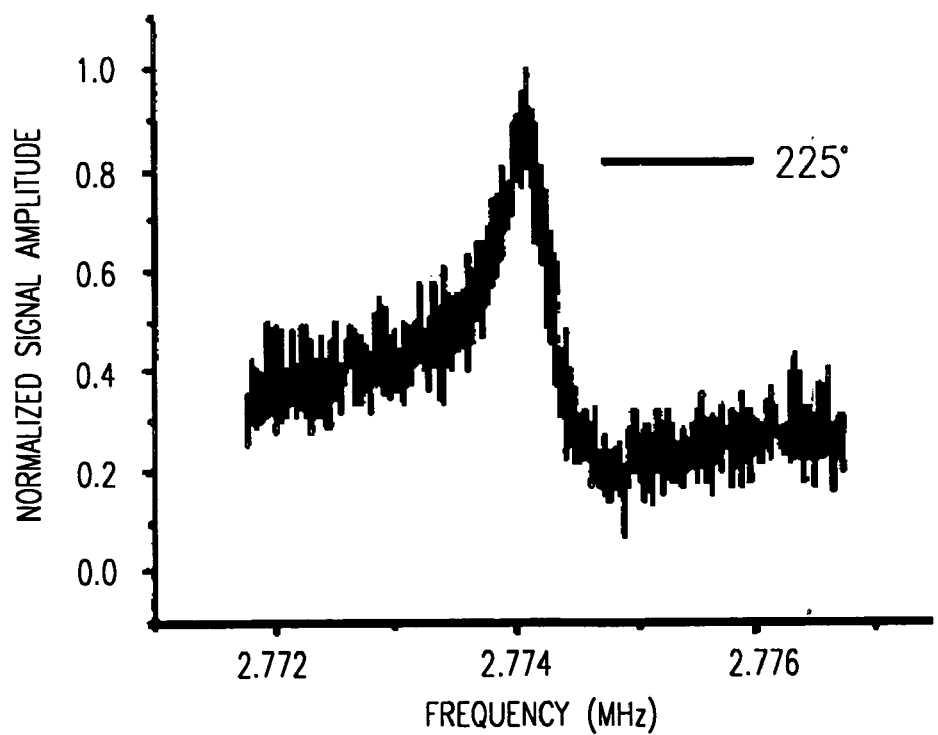
FIG. 8 is a graph showing normalized signal amplitude for another of the driving laser locations of FIG. 6.
Figure 9:
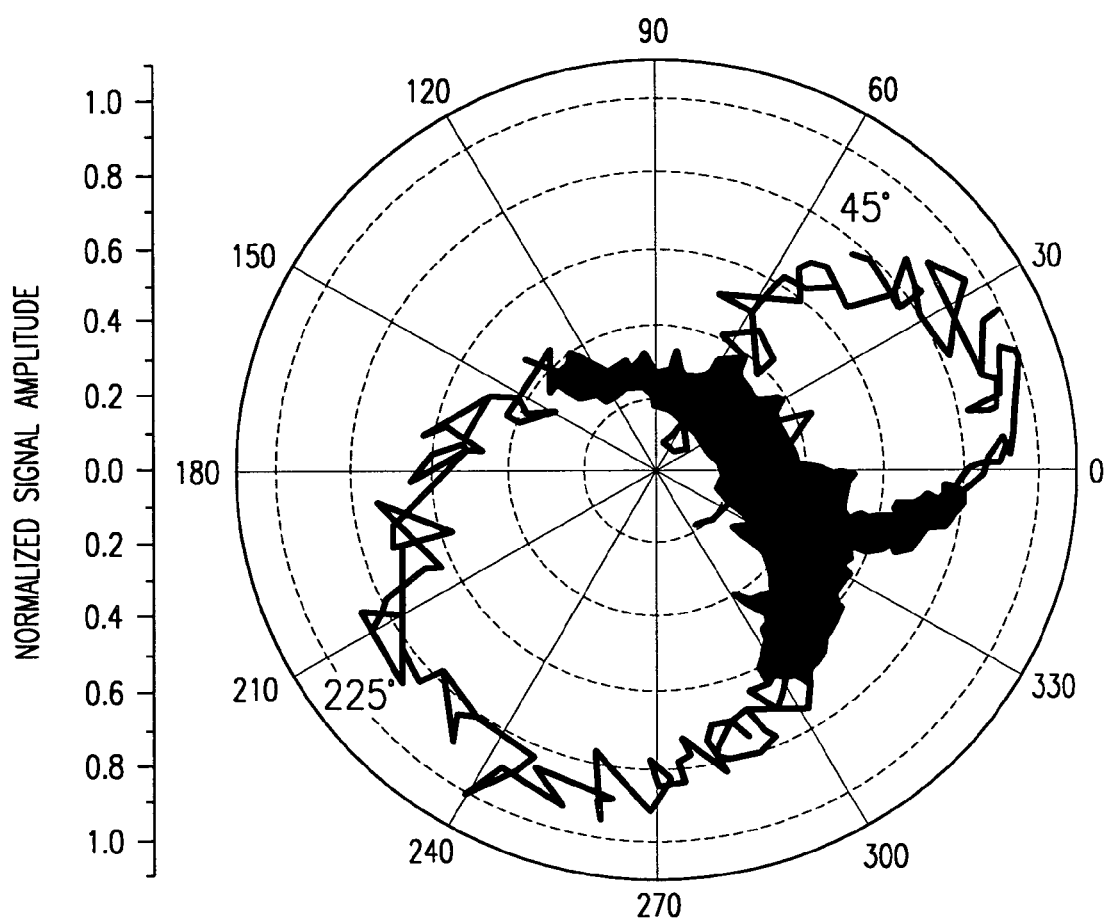
FIG. 9 is a graph in polar coordinates showing normalized signal amplitude on the surface of the dome type actuator of FIG. 6.
Figure 10A:
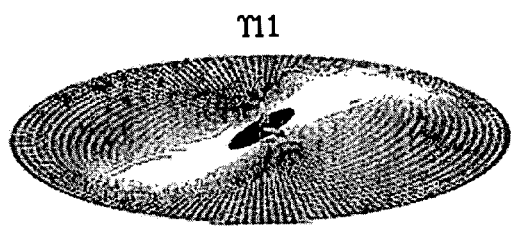
FIG. 10A, 10B, 10C, 10D, 10E, and 10F are diagrams showing various modes of vibrations arranged by increase in resonant frequency for an example dome resonator.
Figure 10B:
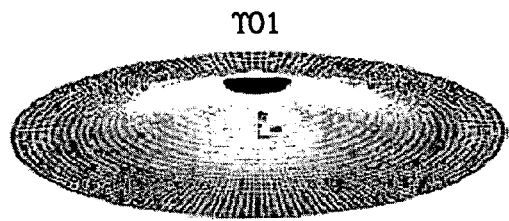
Figure 10C:
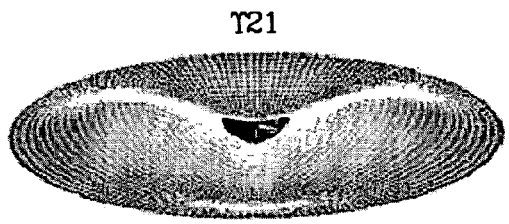
Figure 10D:
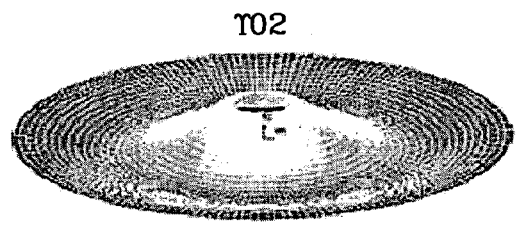
Figure 10E:
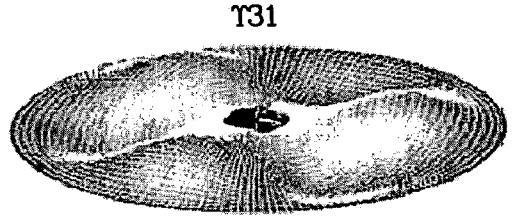
Figure 10F:
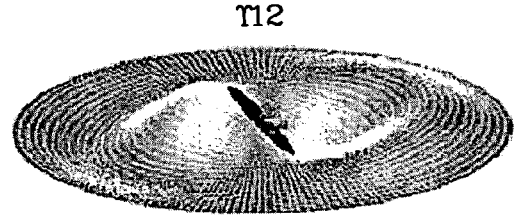

FIG. 6 shows locations of two different driving lasers at 45° and 225°. FIGS. 7 and 8 show a normalized signal amplitude versus frequency in MHz for the respective angles. The resonance peaks are shown in rectangular coordinates. FIG. 9 shows resonance peaks in polar coordinates, illustrating a 180° phase shift for diametrically opposite locations of the driving beams. This mode recognition technique, applied to the dome-type resonators allows identification of four low frequency modes $\gamma_{11}, \gamma_{01}, \gamma_{21}$ and $\gamma_{02}$. Experimental values for the resonant frequencies and quality factors for these and higher modes are collected in the following Table 1.

TABLE 1

| Mode | f, MHz | Q |
|---|---|---|
| $\gamma_{11}$ | 3.66 | 8240 |
| $\gamma_{01}$ | 4.08 | 4350 |
| $\gamma_{21}$ | 5.48 | 8365 |
| $\gamma_{02}$ | 6.98 | 9720 |
| | 9.78 | 9000 |

The shape of the modes for the dome resonator, obtained by FEA, are shown in FIGS. 10A, 10B, 10C, 10D, 10E and 10F. The resonator is represented as a partial spherical shell with outer diameter 60 μm, 8 μm inner hole diameter, 0.25 μm polysilicon film thickness, 1.3 mm dome height. Shell elements were used for modal analysis. The remaining stress was neglected.

By taking into account the center of mass motion for the different modes of the dome's vibration, it appears that the observed difference in quality factors may be due to the clamping losses.

Figure 11:
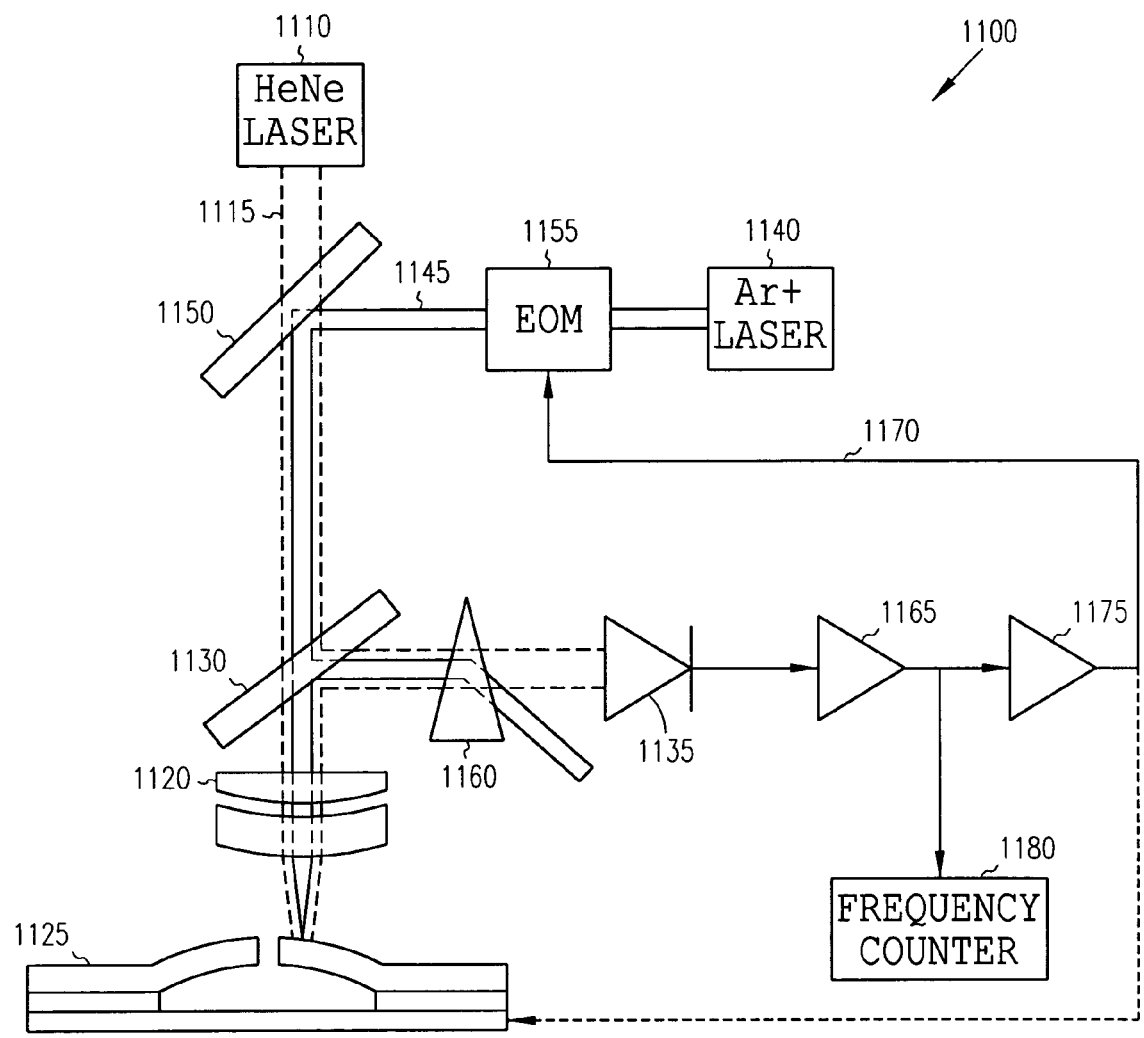
FIG. 11 is a block schematic diagram of an optical implementation of positive feedback utilizing a dome resonator as a frequency-determining element according to an example embodiment.

In a further embodiment, a frequency generator utilizing a dome resonator or oscillator as a frequency-determining element is indicated generally at 1100 in FIG. 11. A He—Ne laser 1110 is used to provide a beam 1115 that is focused by an objective lens 1120 onto a 2 μm spot size on the surface of a dome resonator 1125. The same lens 1120 may be used to collect reflected light. A nonpolarizing beam splitter 1130 is used to direct the reflected laser beam to a wideband photodetector 1135.

A second laser (Ar+) at 1140 may be used to provide a blue laser beam 1145. A mirror or beamsplitter 1150 may be used to direct the blue laser beam through the same objective lens 1120. It is focused into a 2 μm spot and can be positioned independently of the red (HeNe) laser beam 1115. The intensity of the Ar⁺ laser can be controlled by an Electro Optical Modulator (EOM) 1155 with an 80 MHz bandwidth. An additional dispersing prism 1160 may be positioned in front of the photodetector to avoid saturation by the blue laser.

Positive feedback may be provided closed by selectively amplifying the AC voltage at amplifier 1165 from the photodetector and applying the resulting signal via line 1170 as a modulation of the driving beam intensity by controlling the EOM 1155. Amplifier 1165 is a tunable amplifier MATEC615 (Gain 120 dB, Q=20). A high voltage amplifier 1175 (ENI, broadband gain 50 dB) is coupled in series to provide sufficient gain to ensure access to the self-oscillatory regime. The tunability of amplifier 1165 allows the excitation of selected modes from the spectrum of the dome oscillator 1125 in the frequency region up to 27 MHz. Since $Q_{amplifier} \ll Q_{resonator}$, the operation of the generator is determined solely by the MEMS component.

For a 60 µm outer diameter dome, a self-oscillatory regime may be obtained for any of the 5 modes listed in Table 1. In one embodiment, a 12 digit frequency counter 1180 (measuring time 100 ms) may be used to monitor the frequency stability of the tunable amplifier 1165 output. In one embodiment, a time record of the counter read-out, may show <0.8 ppm standard deviation for the frequency values measured over a 3 minute interval. A long-time drift toward higher frequency values may be attributed to mechanical drift of the laser spot over the dome.

In a further embodiment, positive feedback is obtained with the use of piezoelectric element coupled to the dome resonator 1125. The piezoelectric element is controlled by the output of the high voltage amplifier 1175. This feedback may take the place of the feedback to modulate the laser 1140 output.

The high stability of the optically operated MEMS generator can be readily utilized in a setup that employs a MEMS resonator as a sensor. Easily converted to a digital form, the frequency output carries information on added mass, periodic force or force gradient affecting the resonator.

Applications the shell-type MEMS resonators in RF wireless devices stimulate ongoing research that will enable the integration of a dome oscillator into CMOS environment. The project includes an implementation of the described thermomechanical actuation with the laser beam replaced by a microwatt power, microfabricated local Joule heater. Full CMOS-integrated version of the MEMS frequency generator with capacitive pick-up and thermal drive is expected as a result of the project.

CONCLUSION

Radio frequency dome or shell-type polysilicon micromechanical resonators (bowed up out-of-plane) were fabricated employing the compressive stress incorporated in LPCVD-deposited film. Thermal stress introduced by the modulated laser light was demonstrated to be an effective driving mechanism for these dome-type resonators. Significant out-of plane deflections may be actuated by mechanical stress introduced within the plane of the shell. Thermomechanical stress may be provided by a focused laser beam or microfabricated resistive heater. All-optical operation may be provided by employing two different wavelength laser beams for drive and detection. The local nature of the laser actuation technique may be used to induce modes of vibration that are not easily seen using a piezo-electric or capacitive drive. Mode identification may be achieved by monitoring the phase shift between drive signal and detected motion at different locations.

Shell-type micromechanical resonators operating in the radio frequency range may be fabricated utilizing mechanical stress that is built into polysilicon thin films. A significant increase of the resonant frequency (compared to flat, plate-type resonators of the same size) and the rich variety of vibrating modes demonstrate great potential for "2.5-Dimensional" MEMS structures. A finite curvature of the shell also provides a novel mechanism for driving resonators by coupling in plane stress with out of plane deflection. By modulating the intensity of a low power laser beam (P~10 µW) focused on the resonator we introduced a time-varying, in-plane, thermomechanical stress. This stress modulation resulted in experimentally observed, large amplitude, out-of-plane, vibrations for a dome-type resonator.

The invention claimed is:

1. A micromechanical resonator comprising:
   a substrate;
   a partial curved shell clamped on an outside portion of the shell to the substrate, wherein the shell is formed entirely of a non-electro active material compatible with CMOS processes to resonate at RF frequencies or higher responsive to localized time variable heating of only a portion of the shell.

2. The resonator of claim 1 wherein the shell is formed of polysilicon.

3. The resonator of claim 1 having a quality factor of approximately 9,000 or above.

4. The resonator of claim 1 wherein the shell exhibits out-of-plane motion in response to local heating.

5. The resonator of claim 1 wherein the shell has a resonant frequency of at least approximately 9 MHz.

6. The resonator of claim 1 having a static deformation of approximately 0.3 µm.

7. The resonator of claim 1 and further comprising a detecting laser proximate the shell that detects deformation of the shell in response to heat.

8. The resonator of claim 1 wherein the shell deforms in response to thermal expansion, magnetostriction, or optically-induced stress.

9. The resonator of claim 1 wherein the shell exhibits out-of-plane motion in response to local heating of a portion of the shell.

10. The resonator of claim 9 wherein the shell is formed to distort in response to surface acoustic waves launched from the local heating of the portion of the shell.

11. The resonator of claim 9 wherein the shell is formed to distort in response to inhomogeneous, in-plane stress caused by the local heating of the portion of the shell.

12. A micromechanical resonator comprising:
    a substrate;
    a partial curved shell consisting of a non-electro-active CMOS process compatible material clamped on an outside portion of the shell to the substrate; and
    means for inducing movement of the shell.

13. The resonator of claim 12 wherein the means for inducing movement of the shell comprises a laser focused on a selected portion of the shell.

14. The resonator of claim 13 wherein the laser comprises an AC component proximate a resonant frequency of the shell.

15. The resonator of claim 12 wherein the means for inducing movement of the shell comprises a resistive heater coupled to a selected portion of the shell.

16. The resonator of claim 12 wherein the means for inducing movement of the shell creates a time variable local stress to launch surface acoustic waves over the shell.

17. A micromechanical resonator comprising:
    a substrate;
    a CMOS process compatible curved disc clamped on an outside portion of the disc to the substrate;
    means for inducing movement of the disc; and
    means for detecting movement of the disc.

18. The resonator of claim 17 wherein the means for inducing movement of the disc comprises a laser focused on a selected portion of the disc, and the means for detecting movement of the disc comprises a photodetector that receives reflected laser light from the disc.

19. The resonator of claim 17 wherein the means for inducing movement of the disc comprises a laser focused on a selected portion of the disc, and the means for detecting movement of the disc comprises an interferometer.

20. The resonator of claim 17 wherein the resonator exhibits different modes of vibration as a function of resonant frequency of the resonator.

21. The resonator of claim 17 and further comprising means for providing feedback.

22. The resonator of claim 21 wherein the resonator operates as a frequency generator with the shell acting as a frequency determining element.

23. The resonator of claim 17 wherein the means for inducing movement of the disc uses in-plane stress to induce out-of-plane motion.

24. The resonator of claim 23 wherein the means for inducing movement affects a ring along a significant part of the circumference of the disc.

25. The resonator of claim 17 wherein the disc comprises a partial spherical shell.

26. The resonator of claim 17 wherein the disc is substantially circular.

27. The resonator of claim 17 wherein the disc has a hole in the center of the disc.

28. A micromechanical resonator comprising:
a substrate;
a partial curved shell clamped on an outside portion of the shell to the substrate, wherein the shell is formed of a CMOS compatible material and has an opening on the center, the shell to resonate at RF frequencies or higher; and
a heater positioned proximate the shell to create a time varying temperature gradient across the shell to cause the shell to resonate.

29. The resonator of claim 28 wherein the partial shell is spherical and exhibits out-of-plane motion in response to local heating of a portion of the shell.

30. The resonator of claim 29 wherein the shell is formed to distort in response to surface acoustic waves resulting from the time varying temperature gradient.

31. The resonator of claim 29 wherein the shell is formed to distort in response to inhomogeneous, in-plane stress resulting from the time varying temperature gradient.

* * * * *